(12) United States Patent
Rudolph et al.

(10) Patent No.: US 7,832,894 B2
(45) Date of Patent: Nov. 16, 2010

(54) ILLUMINATING DEVICE FOR MICROSCOPES

(75) Inventors: Günter Rudolph, Jena (DE); Jochen Müller, Jena (DE); Eva-Maria Menzel, Jena (DE); Bryce Anton Moffat, Jena (DE); Andreas Nolte, Rosdorf (DE)

(73) Assignee: Carl Zeiss MicroImaging GmbH, Jena (DE)

( * ) Notice: Subject to any disclaimer, the term of this patent is extended or adjusted under 35 U.S.C. 154(b) by 370 days.

(21) Appl. No.: 11/922,909

(22) PCT Filed: Jun. 22, 2006

(86) PCT No.: PCT/EP2006/006000

§ 371 (c)(1),
(2), (4) Date: Dec. 27, 2007

(87) PCT Pub. No.: WO2007/003275

PCT Pub. Date: Jun. 11, 2007

(65) Prior Publication Data

US 2009/0034248 A1  Feb. 5, 2009

(30) Foreign Application Priority Data

Jul. 1, 2005 (DE) .................. 10 2005 030 761

(51) Int. Cl.
*F21V 9/00* (2006.01)

(52) U.S. Cl. .................. 362/231; 362/244; 362/249.02; 359/387

(58) Field of Classification Search ........... 362/240, 362/244, 249.01, 249.02, 231; 359/387
See application file for complete search history.

(56) References Cited

U.S. PATENT DOCUMENTS

| 4,852,985 | A | 8/1989 | Fujihara et al. |
| 5,489,771 | A | 2/1996 | Beach et al. |
| 6,066,861 | A | 5/2000 | Höhn et al. |

(Continued)

FOREIGN PATENT DOCUMENTS

DE    298 16 055 U1    5/1999

*Primary Examiner*—John A Ward
(74) *Attorney, Agent, or Firm*—Walter Ottesen

(57) ABSTRACT

The invention relates to an illuminating device for microscopes, wherein the light source has, in particular, a white light illumination having total daylight spectrum and/or an excitation light source for fluorescent colors. The inventive illuminating device for a microscope consists of surface or spatially arranged light sources, which are connected to a control unit for generating any desired illuminating patterns and illuminating spectrums, and an illuminating optic to image these illuminating patterns on the object to be examined. The light sources consist of LEDs (11) which excite at least one luminescence color (14) which is adapted to the wavelength which is emitted by the LEDs (11). The LEDs (11) are arranged concentrically to the optical axis of the illuminating device, preferably, in or in the vicinity of the aperture diaphragm plane. The microscope illumination enables realization of flexible illumination structures and illumination spectrums for bright field, dark field, fluorescence, inclined and/or annularly-shaped illumination, and also white light illuminations having total daylight spectrum. Due to the advantages of the LEDs (economical, low power consumption, long service life and easy to control), such illumination devices are particularly suitable for use in the field, for example, in archaeology, geology and in protecting the environment.

19 Claims, 3 Drawing Sheets

U.S. PATENT DOCUMENTS

| | | |
|---|---|---|
| 6,373,568 B1 | 4/2002 | Miller et al. |
| 6,469,322 B1 | 10/2002 | Srivastava et al. |
| 6,795,239 B2 | 9/2004 | Tandler et al. |
| 7,078,732 B1 | 7/2006 | Reeh et al. |
| 2005/0046937 A1 | 3/2005 | Sander |
| 2007/0034885 A1 | 2/2007 | Braune et al. |

ILLUMINATING DEVICE FOR MICROSCOPES

RELATED APPLICATIONS

This application is the national stage of PCT/EP 2006/006000, filed Jun. 22, 2006, designating the United States and claiming priority from German patent application no. 10 2005 030 761.2, filed Jul. 1, 2005, the entire contents of which are incorporated herein by reference.

FIELD OF THE INVENTION

The present invention relates to an illuminating device for microscopes wherein the light source comprises one or several semiconductor emitters and provides especially a white light illumination having full daylight spectrum and/or an excitation light source for fluorescence colorants.

BACKGROUND OF THE INVENTION

In the last few years, there has been a trend in microscope systems which clearly goes in a direction of complex systems wherein the microscope defines an essential component but is to be considered in the context of an overall solution which is mostly computer supported. Increasingly, control and image data evaluation takes place automatically via computers. This effects, for example, the area of automatic scanning systems for primary screening for pathology/cytology or pharmaceutical molecular biology. In addition, a trend toward miniaturization of all components is present. A very essential microscope component is a flexible, compact and reliable illumination.

Classical light sources for microscopes, such as halogen lamps, have disadvantages with respect to these requirements. They are expensive, require high electric power, have a high thermal emission, a short service life and their color spectrum changes with changing brightness. In addition, the constructional configuration and weight are comparatively high.

U.S. Pat. No. 4,852,985 discloses an illuminating device for the flexible configuration of illuminating structures usual for microscopes. Here, semiconductor light sources such as two-dimensionally arranged LEDs are used as light sources. The realization of the different illuminating structures takes place via targeted switch-on of the required LEDs. In addition, a device for adjusting brightness can be present. The different illuminating types in a microscope are realizable without additional optical components because of this targeted switch-on of a number of LEDs. The surface light source can also be configured via the two-dimensional arrangement of LEDs which emit different colors such as red, green and blue (RGB). The arrangement of the individual colors on the array is of great significance in order to generate a color impression as uniformly as possible without color fringes in the object plane. For this purpose, U.S. Pat. No. 4,852,985 discloses a variation for a defined arrangement of LEDs for a three-color array. A ground glass screen is required in this solution to prevent illumination nonuniformity. The ground glass screen is mounted ahead of the surface light source.

An LED light standard for photo microscopy and video microscopy is described in U.S. Pat. No. 5,489,771. In this calibration system, the intensity of a compact LED light source is controlled with the aid of a detector. A diffuser is mounted ahead of the LED light source and, in addition to ensuring a high light homogeneity, the diffuser ensures that a portion of the light radiation incidents on the laterally mounted detector and can be evaluated. In this standard light source, which is usable for calibration, the generated light intensities can be very precisely adjusted in that the energy, which is supplied to the LEDs, can be continuously compared to the detector via the control current loop. Preferably, the compact LED light source comprises LEDs which radiate in different colors (RGG or RGB) and can be individually driven. A single color light can be generated via the targeted driving of the LEDs and the use of bandpass filters. In the generation of pulse modulated light, it is necessary that the camera and/or video camera be correspondingly synchronized.

In DE 199 19 096 A1 (U.S. Pat. No. 6,795,239), a transmitted light illuminating unit for microscopes is described wherein a transparent microscope table is illuminated from below. The illuminating unit comprises one or several LEDs and is so configured that it can be mounted in the aperture diaphragm plane as well as ahead of a Köhler illuminating optic. A suitable scattering means is mounted ahead of the LEDs to ensure an illumination as uniform as possible. A disadvantage of this solution is that, when using only a few LEDs, an insufficient brightness can be made available for some illuminating methods (for example, the phase contrast method). The intensity made available is still further reduced by the use of additional scattering means.

DE 298 16 055 U1 likewise describes a microscope having an illuminating arrangement which is pivotally mounted. The illuminating arrangement is built up of discrete LEDs. With the suggested solution, it is true that with differentiated driving of the LEDs, structured illuminations can be realized such as for bright field, dark field, inclined and annularly-shaped illumination or phase contrast illumination; however, in this context, it is disadvantageous that emission can occur only in discrete wavelengths, as a rule, red, green and blue. A white light illumination with full daylight spectrum, which is relevant for most microscope applications, or other desired emission spectrums cannot be generated with this solution.

The illuminating arrangement described in U.S. Pat. No. 6,373,568 comprises a plurality of individual LEDs which realize different discrete wavelengths. The disadvantage of this solution is the very costly and complicated configuration. In addition, no continuous spectrum can be generated with the described illuminating arrangement.

While with the conventional lamps, which had been used so far as excitation light sources for the fluorescence microscopy, a short service life as well as a high initial cost and maintenance cost were to be expected, the problem in the use of LED illumination as excitation light sources is present that LEDs having an adequate light density are available not for all wavelengths or are very cost intensive. These conventional lamps can be, for example, arc lamps or halogen lamps.

SUMMARY OF THE INVENTION

The present invention is based on the object to eliminate the disadvantages of the known state of the art and to develop a microscope illumination with which the following can be achieved: flexible illuminating structures for bright field, dark field, fluorescence, inclined or annularly-shaped illumination. In addition, white light illumination with full daylight spectrum or another desired spectral distribution as an excitation light source can be realized. For all microscope methods, the solution is intended to realize a sufficient brightness and be simple in assembly and operation.

With the microscope illumination according to the invention, the following can be realized: flexible illumination structures and illumination spectrums for bright field, dark field, fluorescence, oblique or annularly-shaped illumination as well as white light illumination with full daylight spectrum. These illumination arrangements are suitable especially for field use (for example, in archaeology, geology and in environmental protection) because of the special advantages of LEDs (low cost, low power use, long service life and simple controllability). With the microscope illumination of the invention, all essential requirements for a simple, robust and cost effective light source for microscopy are satisfied.

BRIEF DESCRIPTION OF THE DRAWINGS

The invention will now be described with reference to the drawings wherein.

DESCRIPTION OF THE PREFERRED
EMBODIMENTS OF THE INVENTION

The illuminating arrangement according to the invention is for a microscope and comprises surface or spatially-arranged light sources which are connected to a control unit for generating desired illuminating patterns and illuminating spectrums and an illuminating optic for imaging this illuminating pattern onto the object to be examined. The light sources comprise LEDs which excite at least one luminescence colorant which is matched to the wavelength emitted by the LEDs. The LEDs are arranged concentrically to the optical axis of the illuminating arrangement, preferably, in or near the aperture diaphragm plane.

Figure 1:
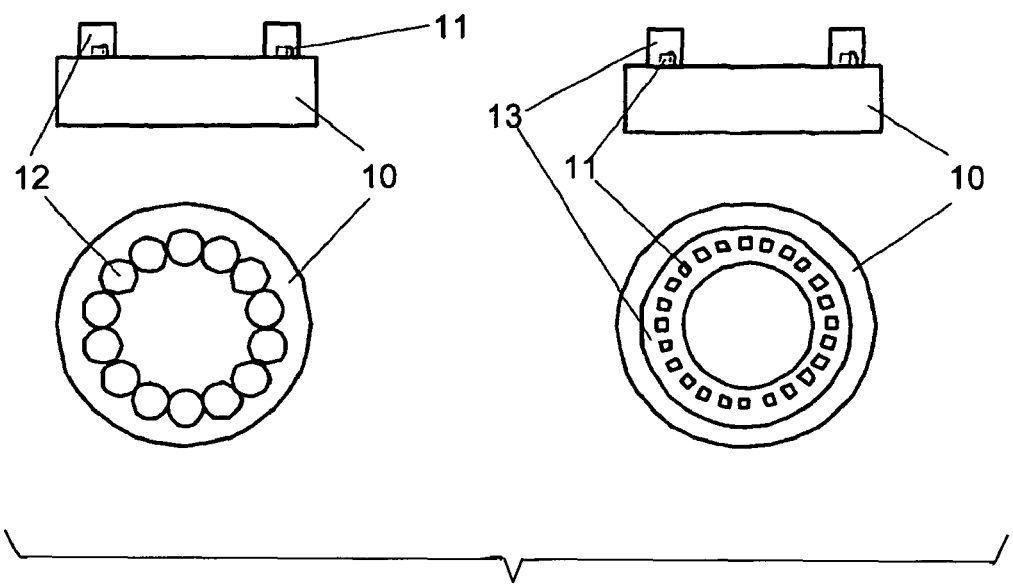
FIG. 1 shows the annularly-shaped arranged LEDs embedded individually or as a group in a substance layer.
Figure 2:
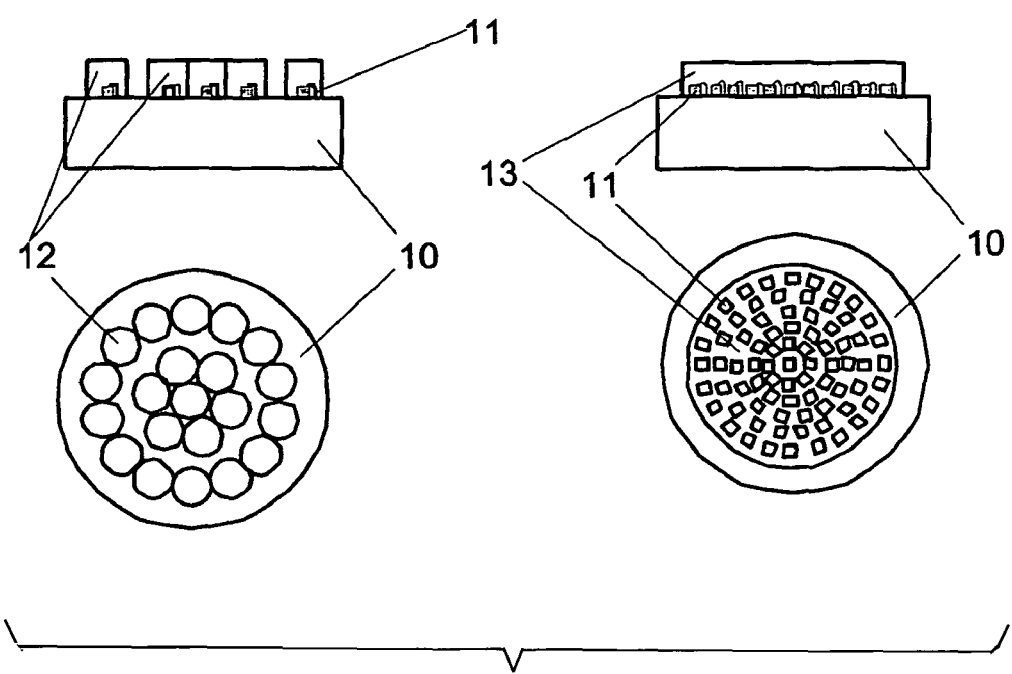
FIG. 2 shows the surface-arranged LEDs embedded individually or as a group in a substance layer.
Figure 3:
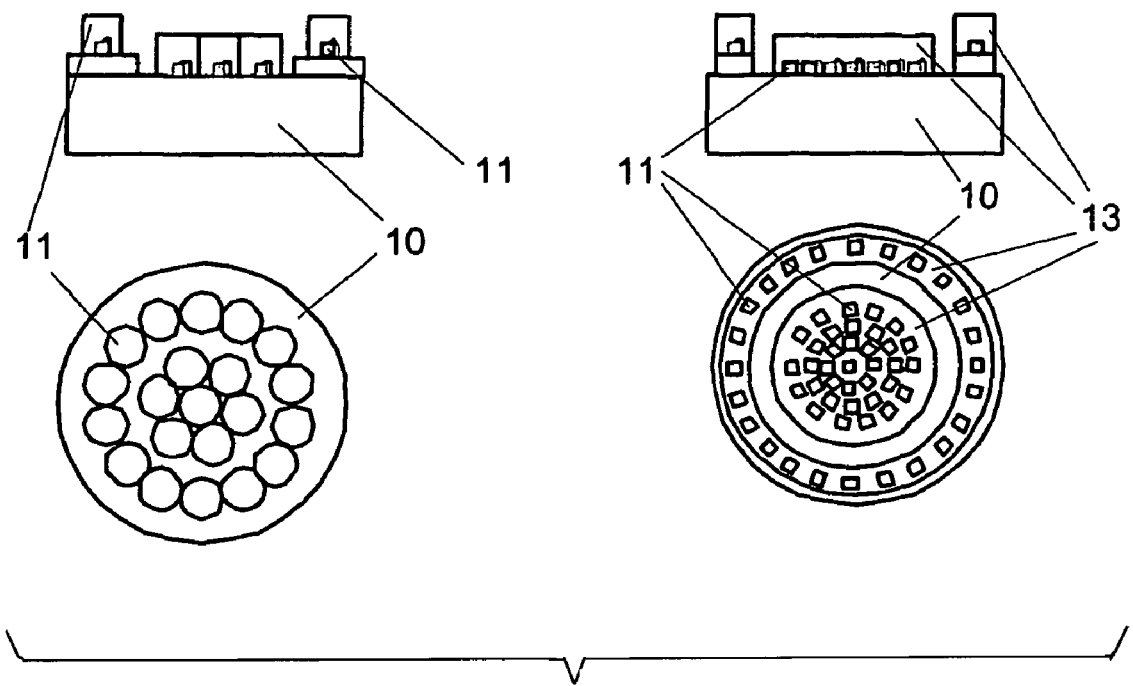
FIG. 3 shows the spatially-arranged LEDs embedded individually or as a group in a substance layer.

FIGS. 1 to 3 show LEDs embedded individually (left figure) or as a group (right figure) in a substance layer. The LEDs 11 are mounted on a carrier plate 10 and are individually embedded in a substance layer 12 or embedded, in common, in a substance layer 13. Also, combinations of both can be realized. The LEDs 11 can be so mounted on the carrier plate 10 that annularly-shaped structures (see FIG. 1), surface-shaped structures (see FIG. 2) or spatially-shaped structures (see FIG. 3) are formed.

The advantage of spatially-arranged light sources is that the LEDs are mounted centrally and in alignment with the optical axis in different planes and, in this way, light can be emitted from virtually any desired point in the vicinity of the forward focal plane of the condenser lens.

The color emitted by the LEDs and the luminescence colorants contained in the substance layer are correspondingly matched to each other. Different emission spectrums can be generated in dependence upon the luminescence colorants contained in the substance layer. The LEDs, which serve to excite, can emit the same spectrum or LEDs are used having radiation spectrums which overlap and which generate a resultant spectrum for excitation.

In a first embodiment, the LEDs are individually embedded or embedded altogether in a substance layer which contains at least one luminescence colorant.

A further configuration provides that the substance layer is mounted with one or even several luminescence colorants as a separate optical component ahead of the LEDs. Here, it is especially advantageous when the separate optical component is configured to be pivotable and can selectively be introduced into the beam path. It is, however, also possible to arrange several different substance layers as separate optical components on a type of filter wheel and to move the same into and out of the beam path via rotation. The substance layers can contain luminescence colorants in dependence upon the LEDs used and these luminescence colorants can be excited via different LEDs.

In a further advantageous embodiment, the light of the LEDs incidents on a mirror to which at least one luminescence colorant is applied. The light, which is emitted from the luminescence colorant, is imaged by an illuminating optic for imaging the illumination spectrum onto the object to be examined. This arrangement affords the advantage that no light of the LEDs, which serves for excitation, reaches the object.

The LEDs, which function to excite, are to be matched to the particular luminescence colorant. Also, several luminescence colorants can be excited by the LEDs. For this purpose, Table 1 lists the names of the 36 most used fluorescence colorants having the corresponding maximum excitation wavelengths $\eta_{Amax}$ in nm.

TABLE 1

| Name | $\eta_{Amax}$ in nm |
|---|---|
| Alexa Fluor 350 | 345 |
| Hoechst 33258 | 345 |
| AMCA | 350 |
| DAPI | 360 |
| BFP | 380 |
| Lucifer Yellow | 425 |
| CFP | 436 |
| NBD | 468 |
| DiO | 488 |
| GFP | 488 |
| Cy2 | 490 |
| Alexa Fluor 488 | 492 |
| Calcein | 494 |
| DTAF | 495 |
| FITC | 495 |
| Fluo4 | 495 |
| Fluo3 | 506 |
| YFP | 514 |
| Ethidium Bromide | 525 |
| Propidium Iodide | 538 |
| Rhodamine B | 540 |
| Cy3 | 550 |
| DiI | 550 |
| TMR | 550 |
| TRITC | 555 |
| Alexa Fluor 546 | 556 |
| Nile Red | 560 |
| DsRed | 565 |
| Alexa Fluor 568 | 578 |
| Cy3.5 | 578 |
| HcRed | 590 |
| Texas Red | 595 |
| Alexa Fluor 633 | 632 |
| Cy5 | 648 |
| Alexa Fluor 647 | 652 |
| Cy7 | 750 |

Whereas the following wavelengths are available for exciting LEDs with sufficient light density: 365, 455, 470, 505, (525), 590, 617 and 625 nm, the light density of LEDs at 525 nm is just adequate for the fluorescence microscopy. No LEDs, which achieve a sufficient light density, are available at the present time for the wavelength range from 530 to 580 nm marked in Table 1.

According to the present solution in accordance with the invention, it is suggested for the excitation of fluorescence colorants having maximum excitation wavelengths $\eta_{Amax}$ of 530 to 580 nm to use white light emitting LEDs in combination with phosphor for the emission of light in the above-mentioned wavelength range.

Figure 4:
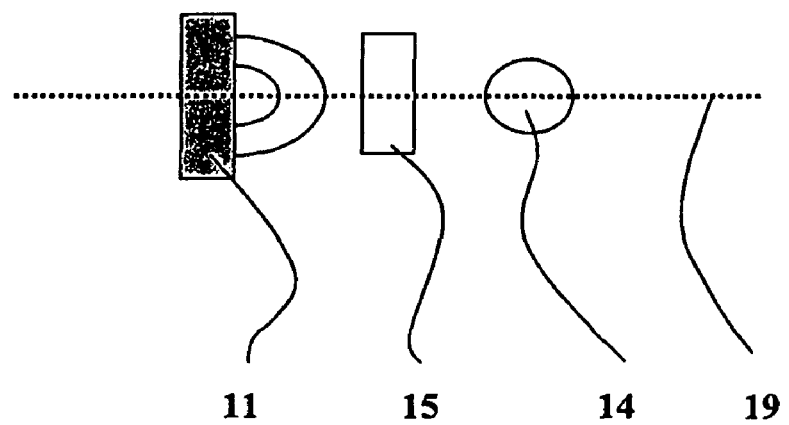
FIG. 4 shows an arrangement wherein the luminescence colorant is mounted forward of the LEDs.

In addition, FIG. 4 shows an arrangement wherein the luminescence colorant 14 is mounted ahead of the LEDs 11. The light, which is emitted by the LEDs 11, is focused via a collector optic 15 on the phosphor which serves as luminescence colorant 14 and is excited and emits light of the wanted wavelength of 530 to 580 nm. The illuminating spectrum, which is imaged on the object to be examined, defines a mixture of light of primary excitation light and light emitted by phosphor.

Figure 5:
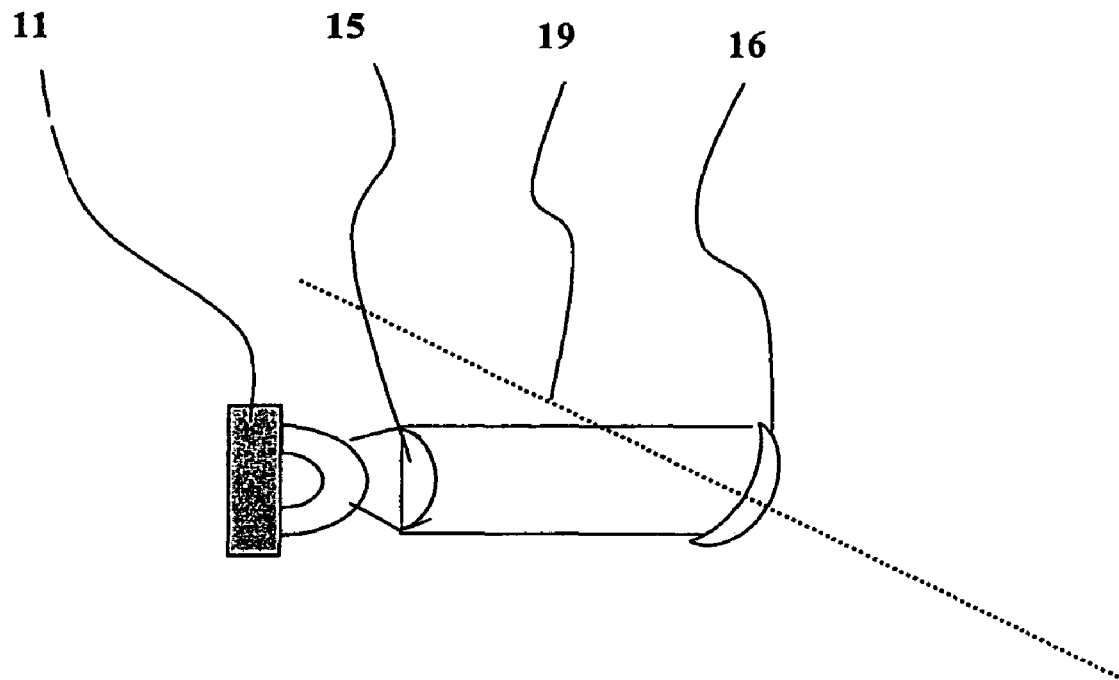
FIG. 5 shows an arrangement wherein the luminescence colorant is applied to a mirror; and, FIG. 6 shows an arrangement wherein the luminescence colorant is applied to the beveled end of a light conductor.

In the preferred arrangement according to FIG. 5, the excitation of the phosphor takes place inclined to the optical axis with the phosphor serving as luminescence colorant 14. For this purpose, the phosphor is applied to a mirror 16 which is irradiated by LEDs 11 at an inclination and is excited. The phosphor emits isotropically in all spatial directions. The portion of the emission in the direction of the object is collected by a collector optic 15. The rearwardly emitted portion is reflected by a mirror 16 and is so directed in the direction toward the object. The significant advantage of this arrangement is that only the light of the wanted wavelength is introduced into the beam path. Preferably, the mirror 16 can be configured as a concave mirror and at least one luminescence colorant 14 is arranged in the focal point of the concave mirror or at least in the proximity thereof.

In a further embodiment, the excitation light emanated by the LEDs is coupled into a light conductor or into a bundle of light conductors. At least one luminescence colorant is applied to the exit surface(s) with the exit surfaces and the optical axis of the microscope conjointly defining an angle preferably unequal to 45°.

Figure 6:
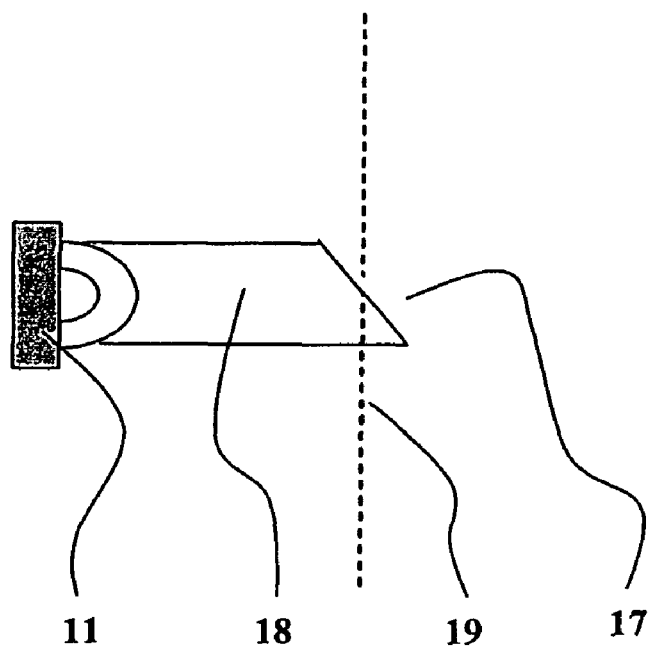

An advantageous configuration of this solution variation is shown in FIG. 6. In this arrangement, at least one luminescence colorant 14 is applied to the exit surface 17 of a light conductor 18 and the light conductor 18 is coupled directly to the LED 11. The end of the light conductor 18 is beveled for increasing the exit surface 17 and therefore the illuminating surface. Here too, phosphor can be used as the luminescence colorant 14. The exit surface 17 of the light conductor 18 and the optical axis 19 of the microscope conjointly define an angle preferably unequal to 45°. Here too, a bundle of light conductors can be used in lieu of the one light conductor 18.

For the excitation, LEDs having a high intensity, such as the type "Luxeon" (from the Lumileds Lighting Company), are used. At 450 nm, these LEDs have, for example, a radiating power of 3 watts.

LEDs emitting blue or ultraviolet light are used for the emission of white light having a full daylight spectrum. The short-wavelength and therefore energy richer blue or ultraviolet light excites the colorants of the luminescence colorant to illumination. Longer wavelength and low energy light is outputted. Since the blue or ultraviolet light is not completely converted, there results a resultant additive mixing of the spectral colors, for example, white light.

In addition to white light, also other colors and/or spectrums can be generated depending upon which luminescence colorant or which combinations of luminescence colorants and which LEDs are used.

For example, for emitting the color magenta, LEDs, which emit blue or ultraviolet light, are, for example, used in combination with a red luminescence colorant. The color magenta cannot be produced with conventional LEDs because this color is not a spectral color.

It is also possible to combine several different luminescence colorants. In principle, every color as well as finely-stepped white nuances (light temperature) is achievable.

By embedding the entire arrangement of LEDs in the substance layer with at least one luminescence colorant, a continuous radiator having a high homogenization of the light emission can be realized. No additional scattering means is then necessary.

In addition to surface or spatially-arranged light sources, the use of individual LEDs with luminescence colorants is also possible. LEDs built up according to this principle are characterized, for example, as luminescence conversion LEDs (Osram: "LUCO-LED") or "phosphor-converted"-LEDs (Lumileds Lighting: "PC-LED").

In an especially advantageous configuration, the unit of surface or spatially-arranged light sources includes arrangements which make possible an exchange of the unit. These light sources are embedded individually or as a group in a substance layer having at least one luminescence colorant. The connections of the light sources to the control unit are also to be configured as exchangeable connections. Units of this kind can be rapidly exchanged for realizing completely different illuminating patterns and/or illuminating spectrums in the microscope.

The LEDs are connected to a control unit for generating any desired illuminating patterns and illuminating spectrums. Any desired LEDs can be ignited by the control unit so that the various types of illumination are possible: bright field, dark field, fluorescence, phase contrast as well as inclined or annularly-shaped illumination. Furthermore, the control unit makes possible a brightness control and time control of the LEDs of the light source so that stroboscope effects can be achieved via a rapid clocking of the LEDs.

Light sources wherein the entire arrangement of LEDs is embedded in a substance layer with luminescence colorant afford the advantage that surface or even spatial continuum radiators arise with which a high homogenization of the light emission and also a greater brightness are achieved. This is so, inter alia, because the LEDs can be arranged closer and therefore a higher packing density is reached.

In a further advantageous embodiment, it is also possible to use a combination of surface or spatially-arranged light sources which are embedded individually or as a group in a substance layer with luminescence colorant.

The LEDs, which are used as light sources, can especially be point-shaped, linear, surface or spatially configured or arranged. In a preferred embodiment, the light source lies as an annular surface or circular surface centrically and aligned to the optical axis of an illuminating system which reflects the light emitted by the LEDs and transmits the same. The LEDs can be correspondingly driven by the control unit so that either all, several or only a single LED is ignited.

The illumination preferred in microscopy up to now is the so-called Köhlersche illumination wherein the light, which is emitted by a light source, is collected by a lens or a lens system (collector) and the image of the light source is focused via a field diaphragm into the aperture diaphragm plane which is disposed in the proximity of the forward focal plane of a condenser lens. The focused image of the light source thereby practically defines a second light source whose light passes through the condenser lens, transilluminates the object plane and therewith the specimen and is taken up by the objective lens of the microscope for the magnification of the specimen.

By using the LEDs, which are to be seen as a point light source, an intermediate imaging of the light source into the aperture diaphragm plane is unnecessary. It is sufficient for the illumination to mount the LEDs directly in or close to the aperture diaphragm plane. In this way, the collector and the field diaphragm can be omitted so that the illuminating system according to the invention becomes smaller and more efficient.

Illuminating systems on the basis of LEDs are cost effective, have a low power consumption, a long service life and are easy to drive. In this way, they are especially suitable for field use, for example, in archaeology, geology and in environmental protection where one is dependent upon battery operation. For a long-term operation in closed-off spaces (satellites), LED illuminations are more suitable than a halogen illumination.

With a system adapted embodiment and arrangement of the LEDs (one or several emitters) or in-coupling into glass fibers and their mixing, there is further the possibility to mix colors and therefore to vary the illumination.

With an LED illumination, higher color temperatures can be reached and the emitted spectrum does not change even with dimming. Furthermore, LED light sources can be rapidly clocked so that stroboscope effects can be achieved which permit living specimens and processes to be better observed.

With the illuminating arrangement according to the invention, a solution is provided with which flexible illuminating structures can be realized for bright field, dark field, inclined or annularly-shaped illumination without additional optical and/or mechanical components being required as in classical microscope illumination.

The invention claimed is:

1. An illuminating device for a microscope to illuminate an object to be examined, the illuminating device comprising:
   a plurality of LEDs arranged in a surface or spatially for emitting light at a predetermined wavelength;
   a luminescence colorant excited by the light emitted by said LEDs;
   a control unit connected to said LEDs for triggering said LEDs to generate a wanted illumination spectrum;
   an illuminating optic mounted downstream of said LEDs for imaging said illumination spectrum on said object;
   said luminescence colorant being matched to said wavelength emitted by said LEDs;
   a mirror;
   said luminescence colorant being applied to said mirror;
   said mirror being mounted so as to cause the light of said LEDs to be incident thereon; and,
   said illuminating optic imaging light emitted from said luminescence colorant to image said illumination spectrum onto said object.

2. The illuminating device of claim 1, wherein said LEDs radiate the same spectrum or whose radiated spectra mutually overlap and generate a resultant spectrum.

3. The illuminating device of claim 1, wherein said illuminating device defines an optical axis; and, said LEDs are arranged concentrically to said optical axis.

4. The illuminating device of claim 3, wherein said illuminating device further defines an aperture diaphragm plane and said LEDs are arranged in or near said aperture diaphragm plane.

5. The illuminating device of claim 1, further comprising an LED assembly including a plurality of substance layers and said LEDs being individually embedded in corresponding ones of said substance layers and each of said substance layers including said luminescence colorant.

6. The illuminating device of claim 5, wherein said substance layers include additional luminescence colorants; and, different emission spectrums can be generated by the LEDs in dependence upon said luminescence colorants contained in the substance layers.

7. The illuminating device of claim 1, further comprising an LED assembly including a substance layer and said LEDs being all embedded in said substance layer; and, said substance layer including said luminescence colorant.

8. The illuminating device of claim 7, wherein said substance layer includes additional luminescence colorants; and, different emission spectrums can be generated by the LEDs in dependence upon the luminescence colorants contained in said substance layer.

9. The illuminating device of claim 7, wherein a continuum radiator having a high homogeneity of light emission results by embedding said LEDs in said substance layer with at least one luminescence colorant.

10. The illuminating device of claim 7,
    wherein said plurality of LEDs embedded in said substance layer with said luminescence colorant is a unit; and, said illuminating device further comprises an arrangement which facilitates an exchange of the unit wherein the connections of the LEDs to said control unit are configured as exchange connections.

11. The illuminating device of claim 1, wherein said luminescence colorant is arranged in front of said LEDs.

12. The illuminating device of claim 1, wherein said mirror is a concave mirror having a focal point; and, said luminescence colorant is disposed at or near said focal point.

13. The illuminating device of claim 1, wherein said microscope defines an optical axis and said illuminating device further comprises a light conductor arranged to couple in said light from said LEDs; said light conductor having an exit surface and said luminescence colorant being applied to said exit surface; and, said exit surface and said optical axis conjointly defining an angle unequal to 45°.

14. The illuminating device of claim 13, wherein said exit surface is beveled and said exit surface and said optical axis conjointly define an angle unequal to 45°.

15. The illuminating device of claim 1, wherein, for the emission of white light with full daylight spectrum, said LEDs emit blue or ultraviolet light.

16. The illuminating device of claim 1, wherein said LEDs, which emit blue or ultraviolet light, are used in combination with red luminescence colorant to emit magenta.

17. The illuminating device of claim 1, wherein, to emit light having a spectrum of 530 to 580 nm, phosphor is used in combination with corresponding ones of said LEDs to excite the same.

18. The illuminating device of claim 5, wherein a continuum radiator having a high homogeneity of light emission results by embedding said LEDs in said substance layers with at least one luminescence colorant.

19. The illuminating device of claim 5, wherein said plurality of LEDs embedded in corresponding ones of said substance layers with said luminescence colorant is a unit; and, said illuminating device further comprises an arrangement which facilitates an exchange of the unit wherein the connections of the LEDs to said control unit are configured as exchange connections.

* * * * *